United States Patent [19]

Doyle

[11] 4,240,846
[45] Dec. 23, 1980

[54] METHOD OF FABRICATING UP DIFFUSED SUBSTRATE FED LOGIC UTILIZING A TWO-STEP EPITAXIAL DEPOSITION

[75] Inventor: Brent R. Doyle, Palm Bay, Fla.

[73] Assignee: Harris Corporation, Melbourne, Fla.

[21] Appl. No.: 919,632

[22] Filed: Jun. 27, 1978

[51] Int. Cl.$^2$ .................... H01L 21/20; H01L 27/02
[52] U.S. Cl. ........................... 148/175; 29/576 W; 29/577 R; 148/187; 148/191; 357/44; 357/46; 357/89; 357/90; 357/92
[58] Field of Search ............... 148/175, 187, 191; 29/576 W, 577; 357/44, 46, 89, 90, 92

[56] References Cited

U.S. PATENT DOCUMENTS

| | | |
|---|---|---|
| 3,823,353 | 7/1974 | Berger et al. .................. 357/92 X |
| 3,909,807 | 9/1979 | Fulton .......................... 148/175 X |
| 3,916,218 | 10/1975 | Berger et al. .................. 357/44 X |
| 3,922,565 | 11/1975 | Berger et al. .................. 357/44 X |
| 3,961,351 | 6/1976 | Blatt ............................. 357/92 |
| 4,051,506 | 9/1977 | Horie ............................ 357/44 X |
| 4,081,697 | 3/1978 | Nakano ........................ 357/44 X |
| 4,106,049 | 8/1978 | Shinozaki et al. ............. 148/175 X |
| 4,140,559 | 2/1979 | Van Vonno .................... 148/175 |

OTHER PUBLICATIONS

McGreivy, et al., "Up–Diffused I$^2$L . . . Process", Tech. Digest Int'l. Electron Devices MTG, Wash., D. C., Dec., 1976, pp. 308–311.
Stone, J. L., "I$^2$L:A Comprehensive Review . . . of Technology", Solid State Technology, Jun., 1977, pp. 42–48.

Primary Examiner—L. Dewayne Rutledge
Assistant Examiner—W. G. Saba
Attorney, Agent, or Firm—Leitner, Palan, Lyman, Martin & Bernstein

[57] ABSTRACT

A complementary pair of vertically aligned, inversely operated transistors formed from a P type substrate, a first N type epitaxial layer, a second N type epitaxial layer and a buried, updiffused P type region between the two epitaxial layers. The impurity concentration of the buried region decreases from its junction with the first epitaxial layer to its junction with the second epitaxial layer whose impurity concentration is less than that of the first epitaxial layer. High impurity concentration N type guard ring and P type base ring are diffused simultaneously with the out diffusion of the buried P type region into the second epitaxial layer. The substrate, first epitaxial layer and buried region constitute the emitter, base, and collector of the inverse vertical PNP transistor and the first epitaxial layer, buried region and second epitaxial layer constitute the emitter, base, and collector of the inverse vertical NPN transistor.

12 Claims, 10 Drawing Figures

METHOD OF FABRICATING UP DIFFUSED SUBSTRATE FED LOGIC UTILIZING A TWO-STEP EPITAXIAL DEPOSITION

BACKGROUND OF THE INVENTION

The present invention relates generally to integrated injection logic (I²L) and more specifically to an improved substrate fed logic (SFL) semiconductor structure.

A typical example of a substrate fed logic semiconductor structure of the prior art is illustrated in FIG. 3b of the U.S. Pat. No. 3,916,218. The structure consists of four layers alternating, namely P1, N1, P2 and N2. The four layers form the complementary, vertical, inversely operated bipolar transistors. This structure has technical drawbacks. For example, by using an epitaxial layer P2 as the base of the NPN transistor, the base width will vary with epitaxial thickness and taper control. This is undesirable in a neutron radiation hardened circuit. Neutron radiation introduces recombination sites in the base and the gain becomes limited by base transport factor vs pre-radiation gain domination by emitter efficiency. Since the base transport factor is strongly related to the base width, the post neutron gains will vary with the epitaxial thickness control. This unpredictable variation in post neutron gain makes the semiconductor structure of U.S. Pat. No. 3,916,218 undesirable for a radiation hardened design. Similarly, P2 has a constant doping profile and hence does not have either an aiding or hindering electric field affecting upwards gain. Similarly, by the use of an epitaxial P2 layer, the P and N+ diffused regions must be diffused down to and through region P2, respectively. This increases the total diffusion time and, consequently, produces undesirable epitaxial junction movement, which is a function of the square root of the product of diffusion time and temperature.

To increase the inverse gain and $f_T$ of integrated injection logic structures, the prior art has suggested upward diffusing the base of the NPN vertical transistor. The updiffused base structure is discussed in "Integrated Injection Logic" in research disclosure No. 48, Page 67 by Industrial Opportunities Limited of Homewell, England. The structure is formed by outward diffusion of boron through a top epitaxial layer to the top of the said epitaxial layer. The resulting structural has an NPN base width which varies as the top epitaxial thickness varies. This produces the same undesirable results discussed in for U.S. Pat. No. 3,916,218.

The I²L structures of the prior art generally are not radiation hardened to three simultaneous environments, namely total gamma dose hardness, neutron hardness, and dose rate hardness. Thus there exist a need for an I²L structure which is radiation hardened to three simultaneous environments.

SUMMARY OF THE INVENTION

The present invention provides an I²L structure having a vertical PNP injector which improves total gamma dose hardness over lateral PNP structures, a thin updiffused intrinsic NPN base region which provides neutron hardness and a P+ type extrinsic NPN base to provide dose rate hardness. The vertical PNP structure is not subject to total gamma dose induced gain deterioration as lateral PNPs used in most I²L structures as base transport is not dominated by surface recombination. The current gain deterioration caused by neutron radiation is minimized in the structure of the present invention by using a thin updiffused base layer. The updiffused layer has a concentration gradient producing an electric field which aids minority carrier transport across the base. Higher neutron levels are then required to bring the base minority carrier diffusion length down to the order of the base width. Since down diffusion of the P layer into the first epitaxial layer also occurs, the impurity level of the first layer is selected higher than that of the second epitaxial layer. The down diffusing P type impurities are then compensated out and the net aiding electric field is obtained. Dose rate hardness is examined relative to when the NPN transistor is in the off logic state. Photocurrent collected by the NPN base region must flow laterally through the base and out of the NPN base contact. The use of a P+ extrinsic base contact minimizes resultant voltage drops which, therefore, require higher radiation dose rate or ionizing lever before a $V_{be}$ drop is built up in the base turning the NPN on than if a P− extrinsic base is used.

The substrate fed logic semiconductor structure of the present invention includes a P− substrate having a first N type epitaxial layer thereon and a second N− epitaxial layer on the first N type epitaxial layer. An upward diffused P type buried region lies between the N and N− epitaxial layers. A diffused P+ base ring makes contact with the buried, upward diffused P region and a diffused N+ guard ring makes contact with the first N epitaxial layer. The first N type epitaxial layer has impurity concentration of approximately two orders of magnitude greater than the impurity concentration of the second N− epitaxial layer. The upward diffused P type region has an impurity concentration substantially equal to that of the second N− epitaxial layer at their junction. The up diffused P type region has an impurity concentration increasing towards its junction with the first N epitaxial layer. The P+ substrate, the first N type epitaxial layer and the upward diffused P type buried region form the emitter, base and collector respectively of a vertical inversely operated PNP transistor and the first N type epitaxial layer, the upward diffused buried P type region and the second N− type epitaxial form the emitter, base and collector respectively of a vertical, inversely operated NPN transistor.

The method of fabricating the substrate fed logic semiconductor structure of the present invention includes epitaxial forming a first N type conductivity type layer of a P+ type substrate followed by depositing P type impurities on the surface of the first type epitaxial layer either selectively or nonselectively. A second $N^{31}$ conductivity epitaxial layer is then grown having a lower impurity concentration than the first N type epitaxially grown layer. Depositing P+ type impurities in the top surface of a second epitaxial layer to define the base ring and depositing N+ conductivity type impurities in the top surface of the second epitaxial layer to define a guard ring. Simultaneously diffusing the buried P type impurities, the surface P+ impurities and the surface N+ impurities to form a base ring extending from the surface of the first epitaxial layer down to the upward diffused buried P region and an N+ ring extending down from the surface of the second epitaxial layer down to the first epitaxial layer. An insulating layer is formed and openings provided therein for contacts to the second epitaxial layer, the P+ base ring and the N+ guard ring. Separate contact is made to the P+ substrate.

OBJECTS OF THE PRESENT INVENTION

An object of the present invention is to provide an I$^2$L semiconductor structure which is radiation hard to gamma dose, neutrons and dose rate.

Another object of the present invention is to provide an SFL semiconductor structure including complementary, vertical, inversely operated bipolar transistors manufactured with reduced diffusion time.

A further object of the invention is to provide a method of fabricating I$^2$L and SFL structures which over comes the problems of the prior art.

Still another object of the invention is to provide a method of fabrication of I$^2$L of SFL which produces a device which is radiation hardened to total gamma dose, neutron and radiation rate.

Other objects, advantages, and novel features of the invention will become apparent from the following detailed description of the invention when considered in conjunction with the accompanying drawings.

DESCRIPTION OF THE PREFERRED EMBODIMENTS

Figure 4:
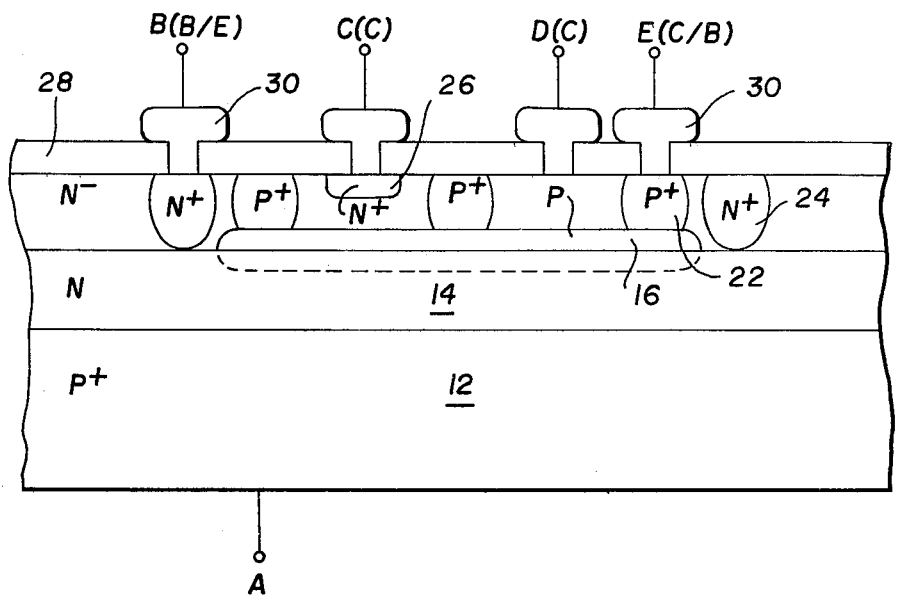
Figure 8:
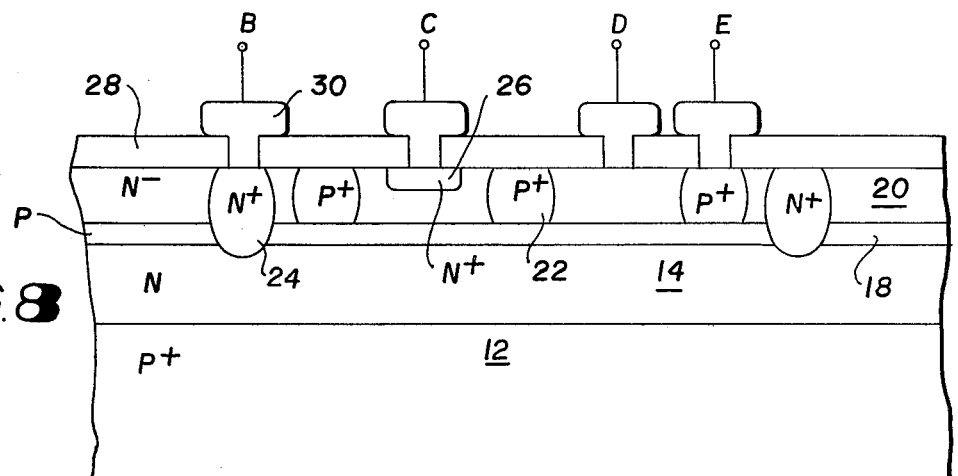
Figure 9:
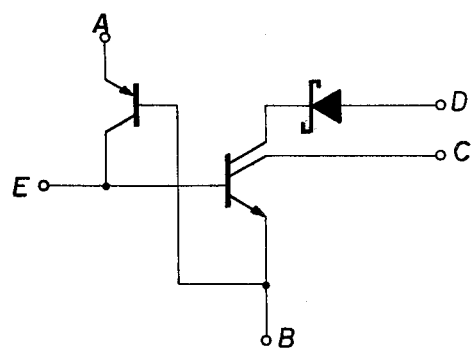
FIG. 9 is a schematic representation of the semiconductor structures of FIGS. 4 and 8.

The substrate fed logic semiconductor structure, incorporating the principles of the present invention, are illustrated in FIGS. 4 and 8 including vertical, inversely operated PNP and NPN transistors. PNP transistor includes an emitter formed from the substrates 12, a base formed from epitaxial layer 14 and a collector formed from upwardly diffused, selectively formed region 16 or nonselectively formed region 18. NPN transistor includes an emitter formed from epitaxial layer 14, a base from upwardly diffused layers 16 or 18 and a collector formed from epitaxial layer 20. Contact point A is made to substrate 12, contact B is made to the N+ guard ring 24 which contacts the epitaxial layer 14, contact region C makes an ohmic contact with epitaxial layer 20 through an N+ surface region 26, contact D makes a Schottky contact with epitaxial layer 20 and contact E makes a contact with the buried region 16 or 18 through P+ ring 22. The schematic is illustrated in FIG. 9.

Figure 1:
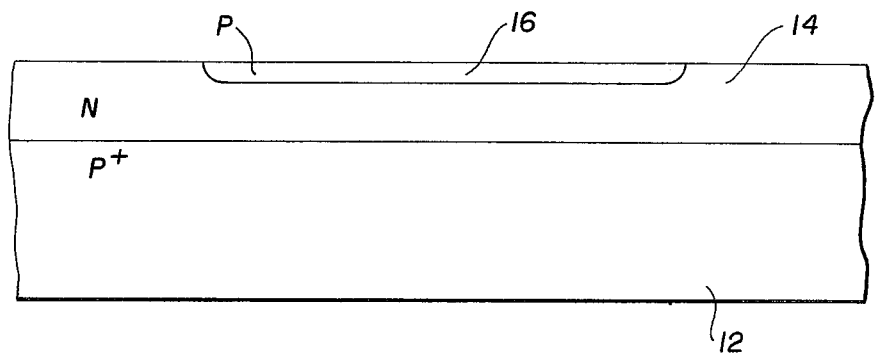
FIGS. 1-4 are cross-sectional views of a semiconductor structure illustrating the preferred method of fabricating the semiconductor structure incorporating the principles of the present invention using a selectively formed buried P region.
Figure 5:
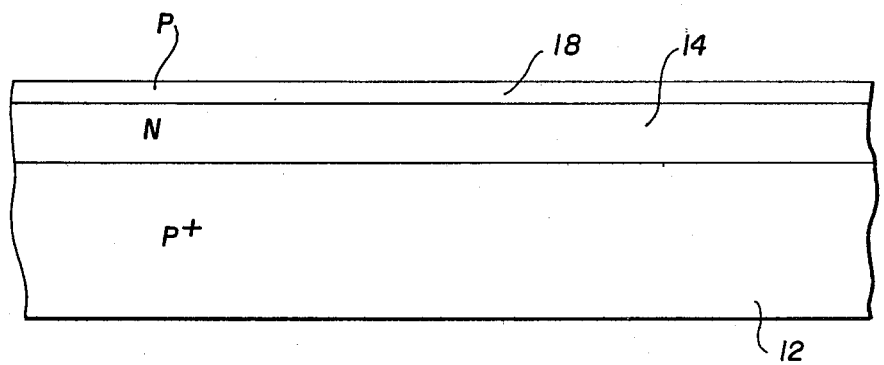
FIGS. 5-8 are cross-sectional views illustrating a preferred method of fabricating the semiconductor structure of the present invention using a nonselectively formed buried P type region.

The method of fabricating the structures of FIGS. 4 and 8 begin with epitaxially forming N type layer 14 on P+ substrate 12. The substrate 12 may be silicon doped with boron, have an impurity concentration of, for example, $1 \times 10$ atoms per cubic centimeter and a bulk resistivity of 0.01 ohm-centimeter. The first epitaxial layer 14 may be grown to a thickness, for example, 3 microns, having an impurity concentration of arsenic or antimony of approximately $10^{17}$ atoms per cubic centimeter and a nominal bulk resistance of 0.1 ohm centimeters. P type impurities are introduced into the top surface of the first epitaxial layer 14 to form selectively regions 16 of FIG. 1 or nonselective layer 18 of FIG. 5. Impurities, for example, boron may be deposited by ion implantation or by deposition having an initial concentration of $3 \times 10^{12}$ atoms per square centimeter, for example. The selective depositing of impurities is through a mask on layer 14 having an opening therein. The mask may be a layer of silicon dioxide having an opening formed by etching through a developed layer of photoresist.

Figure 2:
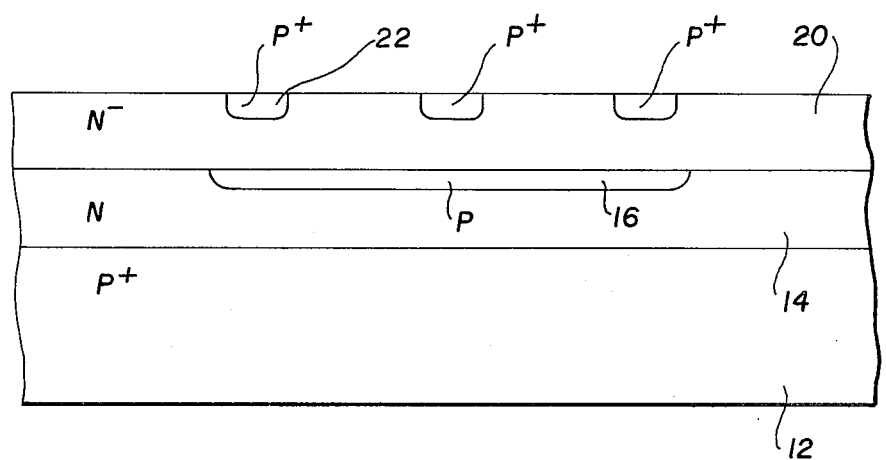
Figure 6:
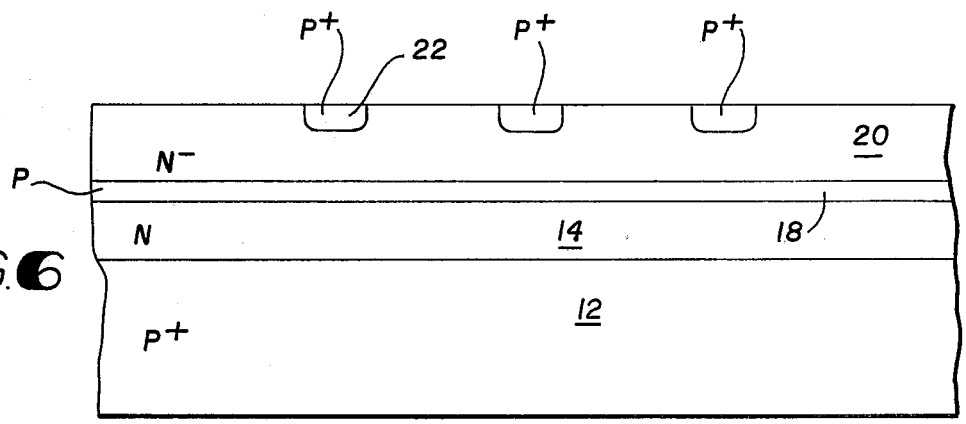

A second epitaxial layer 20 is then grown on the first epitaxial layer 14 to a thickness of approximately 2 microns being doped with arsenic or antimony to a impurity concentration of approximately $3 \times 10^{15}$ atoms per cubic centimeter and having a nominal bulk resistivity of 1 ohm centimeter, for example. P+ impurities are then selectively introduced into the top surface of second epitaxial layer 20 to define base region 22. Boron, for example, may be introduced by deposition or ion implantation through a mask as previously described. The structure of at this stage is illustrated in FIGS. 2 and 6.

Figure 3:
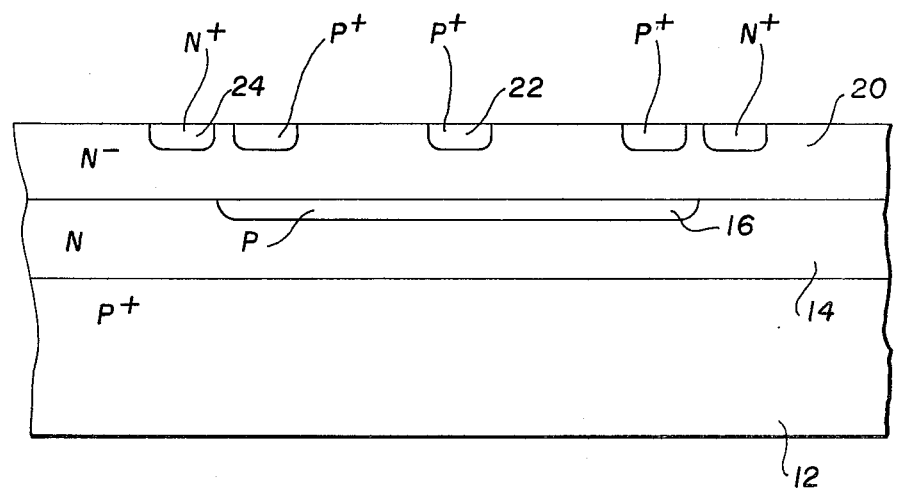
Figure 7:
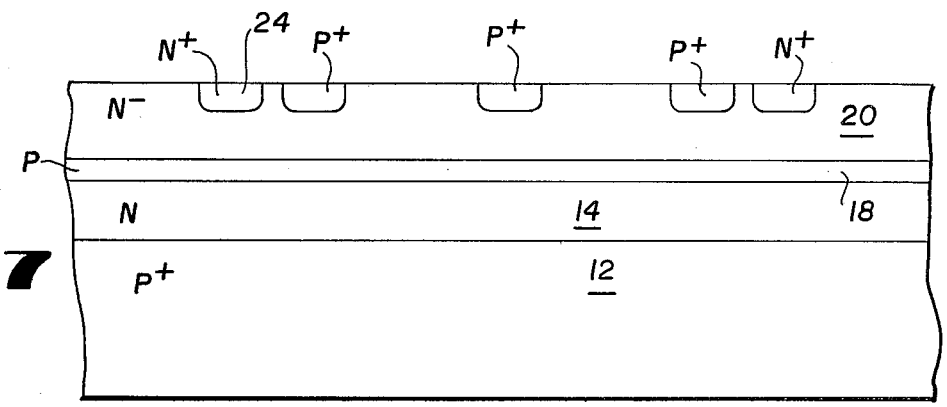

N+ type impurities are then introduced to define guard ring regions 24. These impurities, for example, phosphorus, may be introduced by deposition or ion implantation through a mask as previously described. The resulting structure shown in FIGS. 3 and 7 is subject to a diffusion process so as to simultaneously updiffuse the P type impurities of buried layers 16 or 18 and downwardly diffuse base ring 22 and guard ring 24. The diffusion is carried out until the base rings 22 diffuses down to the upward diffusing buried layer 16 or 18. Similarly, the guard ring 24 is diffused down to the first epitaxial layer 14. In the nonselective formation of buried layer 18 of FIGS. 5-8, it is critical that the guard ring 24 is diffused down from through layer 18 and into the first epitaxial layer 14. In the selectively formed region 16 of FIGS. 1-4, the guard ring 24 need not be diffused down to layer 14 and may stop within the second epitaxial layer 20 short of the boundary between the epitaxial layers 20 and 14. Guard ring 24 should at least be diffused to a depth slightly below the top surface of the upward diffusing region 16. In the resulting structures of FIGS. 4 and 8, the base ring 24 has depth of approximately 2 microns and a sheet resistance less than approximately 60 ohms per square and the guard ring 24 would have a depth of approximately 3 microns and a sheet resistance less than approximately 5 ohms per square. A short diffusion cycle at 1100° C. is sufficient for this drive-in.

If an ohmic contact is to be made to the epitaxial layer 20, N+ impurities must be introduced into the surface as at 26, for example. Arsenic or antimony may be introduced by ion implantation or deposition through a mask to a shallow depth to form a region, having, for example a surface concentration greater than $1 \times 10^{19}$ atoms per cubic centimeter. Due to the relatively low impurity concentration of epitaxial layer 14, a metal contact of aluminium to layer 14 will produce a Schottky barrier therebetween.

An insulating layer 28, for example, silicon dioxide, is formed and delineated to provide openings for the contacts to the various regions. Metalization layer 30, for example, aluminum, is applied to the insulator layer 28 and delineated to provide contacts B, C, D and E to regions 24, 26, 20 and 22, respectively. As illustrated in the schematic of FIG. 9, the aluminum contact C forms an ohmic contact to region 26 of the layer 20 which constitutes the collector of the NPN transistor and the aluminum metal contact D forms a Schottky diode contact with the collector layer 20 of the NPN transistor.

Figure 10:
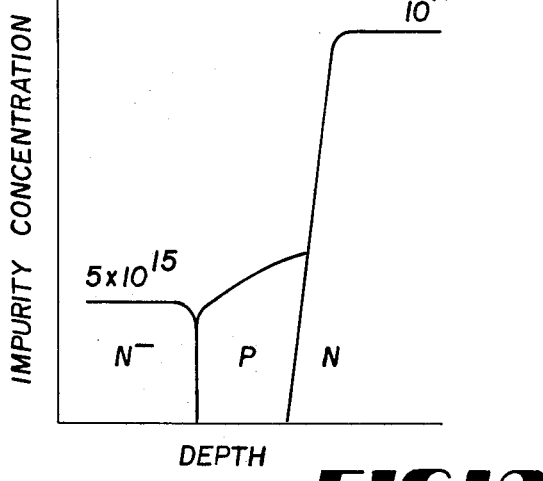
FIG. 10 is a graphic representation of the relative impurity concentrations of selective regions of FIGS. 4 and 8.

The process described provides an upwardly diffused base region 16 or 18 for the NPN transistor. In the impurity profiles illustrated in FIG. 10, the second epitaxial layer 20 has a constant impurity of, for example, $5 \times 10^{15}$ atoms per cubic centimeter. The first epitaxial layer 14 is specifically formed to have a constant impurity concentration of, for example, $1 \times 10^{17}$ atoms per cubic centimeter. The diffused buried region 16 and 18 have an impurity concentration varying from approximately the impurity concentration of the second epitaxial layer 20, namely, $3 \times 10^{15}$ atoms per cubic centimeter at the boundary therewith and increasing towards its boundary with the first epitaxial layer 14 to a level of less than $10^{17}$ atoms per cubic centimeter. Structures of FIGS. 4 and 8 are specifically designed such that the updiffused P layer impurity concentration decreases from the N region 14 which constitutes the emitter of NPN transistor to the lowest impurity concentration epitaxial layer 20 which constitutes the surface collector of the NPN transistor. This critical arrangement of impurity levels in the updiffused P layer provides an electric field in the P layer which aids upward electron flow which is considered critical to the present invention. Processing steps described the high impurity extrinsic base ring 22 and the guard ring 24 as simultaneously diffused, reducing the overall diffusion time and thereby minimizing epitaxial junction movement. Similarly, by using a thin upwardly diffused base region 16 and 18, the amount of diffusion time to form the base ring 22 and guard ring 24 is also reduced.

From the preceding description of the preferred embodiments, it is evident that the objects of the invention are obtained in that an improved substrate fed logic semiconductor structure and method of fabrication is provided. Although the invention has been described and illustrated in detail, it is to be clearly understood that the same is by way of illustration and example only and is not to be taken by way of limitation. The spirit and scope of this invention is to be limited only by the terms of the appended claims.

What is claimed is:

1. A method of fabricating a substrate fed logic semiconductor structure having an injector and complementary transistor comprising:
   epitaxially forming a first N conductivity type layer on a P conductivity type substrate having a lower impurity concentration than said substrate;
   depositing P conductivity type impurities at the surface of said first layer having an impurity concentration less than said first layer;
   epitaxially forming a second N conductivity type layer on said first layer having an impurity concentration less than the impurity concentration of said first layer and deposited P conductivity type impurities;
   depositing P conductivity type impurities in the surface of said second layer having a greater impurity concentration than said P conductivity type impurities at the surface of said first layer; and
   simultaneously diffusing said P conductivity type impurities up from the surface of said first layer into said second layer and P conductivity type impurities down from the surface of said second layer to form a buried P conductivity type region between said two layers and a P conductivity type region extending from the surface of said second layer down to said buried region;
   said substrate, first layer and buried region forming the emitter, base and collector of the injector transistor, respectively and said first layer, buried region and second layer form the emitter, base and collector of the complementary transistor, respectively.

2. The method according to claim 1 wherein said first and second epitaxial layers are formed to have an impurity concentration differing by approximately two orders of magnitude and said P conductivity type impurities are deposited at the surface of said first layer to form said buried region having an impurity concentration of the order of magnitude of said second epitaxial layer at the junction therebetween.

3. The method according to claim 1 wherein said P conductivity type impurities are deposited at the surface of said first layer and upwardly diffused to form said buried region having an impurity concentration equal to the impurity concentration of said second epitaxial layer at the junction therebetween and said buried layer impurity concentration increasing toward the junction of said buried region and said first epitaxial layer but remaining less than the impurity concentration of said first epitaxial layer.

4. The method according to claims 2 or 3 wherein said first epitaxial layer is formed to have an impurity concentration in the order of $10^{17}$ atoms per cubic centimeter and said second epitaxial layer is formed to have an impurity concentration in the order of $10^{15}$ atoms per cubic centimeter.

5. The method according to claim 1 wherein said depositing of P conductivity type impurities at the surface of said first layer is performed nonselectively to form a P conductivity type impurity layer on said first epitaxial layer; and including diffusing N conductivity type impurities from the surface of said second epitaxial layer down into said first epitaxial layer through said P conductivity type buried layer to form a guard ring.

6. The method according to claim 1 wherein said depositing of P conductivity type impurities at the surface of said first layer is performed selectively to form a P conductivity type impurity region in said surface, and including diffusing N conductivity type impurities from the surface of said second epitaxial layer to at least the depth of the top of said up-diffusing buried region to form a guard ring around said buried region.

7. The method according to claim 5 or 6 wherein said N conductivity type impurities diffusion is performed during said simultaneous diffusion.

8. The method according to claim 1 including depositing N type impurities at the surface of said second layer to the order of $10^{19}$ atoms per cubic centimeter to form shallow ohmic contact to said second layer.

9. A method of fabricating a complementing pair of inverse vertically aligned PNP and NPN transistors comprising:
   epitaxially forming a first N conductivity type layer on a P conductivity type substrate having a lower impurity concentration than said substrate;
   depositing P type impurities on a surface of said first epitaxial layer having an impurity concentration lower than said first layer;

epitaxially forming a second N conductivity type layer on said first epitaxial layer having a bulk resistivity an order of magnitude less than the bulk resistivity of said first epitaxial layer;

depositing P conductivity type impurities into the surface of said second epitaxial layer to define a base ring;

depositing N conductivity type impurities into said surface of said second epitaxial layer to define a guard ring; and simultaneously diffusing said deposited impurities to form an up-diffused, buried P type region connected to the surface of said second epitaxial layer by a P type base ring and to form an N type guard ring;

said substrate, said first epitaxial layer and said buried region constitute the emitter, base and collector, respectively of said PNP transistor and said first epitaxial layer, said buried region and said second epitaxial layer consitute the emitter, base and collector of said NPN transistor, respectively.

10. The method according to claim 9 wherein said P conductivity type impurities are nonselectively deposited on said first epitaxial layer and said N conductivity type guard ring is diffused from said surface of said second epitaxial layer down into said first epitaxial layer beyond the junction of said buried region and said first epitaxial layer.

11. The method according to claim 9 wherein said P conductivity type impurities are deposited at the surface of said first layer and upwardly diffused to form said buried region having an impurity concentration equal to the impurity concentration of said second epitaxial layer at the junction therebetween and said buried layer impurity concentration increasing toward the junction of said buried region and said first epitaxial layer, but remaining less than the impurity concentration of said first epitaxial layer.

12. The method according to claim 9 including depositing a shallow region of N type impurities at the surface of said second layer to form ohmic contact to said second layer.

* * * * *

UNITED STATES PATENT AND TRADEMARK OFFICE
CERTIFICATE OF CORRECTION

PATENT NO. : 4,240,846
DATED : December 23, 1980
INVENTOR(S) : Brent R. Doyle

It is certified that error appears in the above-identified patent and that said Letters Patent are hereby corrected as shown below:

Column 1, line 47, delete the word "structural" and insert therefor -- structure --.

Column 1, line 50, delete the word "for".

Column 1, line 54, delete the word "exist" and insert therefor -- exists --.

Column 2, line 19, delete the word "lever" and insert therefor -- level --.

Column 2, line 53, delete "$N^{31}$" and insert therefor -- $N^-$ --.

Column 3, line 16, delete the third occurrence of the word "of" and insert therefor -- or --.

Column 3, line 65, delete "1 x 10" and insert therefor -- $1 \times 10^{19}$ --.

Column 4, line 4, delete the word "selectively" and insert therefor -- selective --.

Column 4, line 16, delete the word "a" and insert therefor -- an --.

UNITED STATES PATENT AND TRADEMARK OFFICE
CERTIFICATE OF CORRECTION

PATENT NO. : 4,240,846

DATED : December 23, 1980

INVENTOR(S) : Brent R. Doyle

It is certified that error appears in the above-identified patent and that said Letters Patent are hereby corrected as shown below:

Column 4, line 24, delete the word "of".

Column 4, line 34, delete the word "diffuses" and insert therefor -- diffuse --.

Column 4, line 39, delete the word "from".

Column 4, line 47, delete "24" and insert therefor -- 22 --.

Column 4, line 47, after the word "has" insert -- a --.

Signed and Sealed this

Fourteenth Day of April 1981

[SEAL]

*Attest:*

RENE D. TEGTMEYER

*Attesting Officer*   *Acting Commissioner of Patents and Trademarks*